(12) United States Patent
Pinna et al.

(10) Patent No.: US 7,642,513 B2
(45) Date of Patent: Jan. 5, 2010

(54) DEVICE FOR OBTAINING THE IMAGE AND/OR SPECTRA OF ELECTRON ENERGY LOSS

(75) Inventors: Henri Pinna, Toulouse (FR); Marcel Tence, Issy-les-Moulineaux (FR)

(73) Assignees: Centre National de la Recherche Scientifique, Paris (FR); Universite Paris SUD 11, Paris (FR)

( * ) Notice: Subject to any disclaimer, the term of this patent is extended or adjusted under 35 U.S.C. 154(b) by 191 days.

(21) Appl. No.: 11/659,354

(22) PCT Filed: Aug. 1, 2005

(86) PCT No.: PCT/EP2005/053745

§ 371 (c)(1),
(2), (4) Date: Oct. 9, 2007

(87) PCT Pub. No.: WO2006/013199

PCT Pub. Date: Feb. 9, 2006

(65) Prior Publication Data

US 2008/0210863 A1    Sep. 4, 2008

(30) Foreign Application Priority Data

Aug. 4, 2004    (FR) ................................ 04 08633

(51) Int. Cl.
*H01J 37/28* (2006.01)
*H01J 37/244* (2006.01)

(52) U.S. Cl. ................ 250/305; 250/306; 250/310; 250/311; 250/397; 382/145

(58) Field of Classification Search ............... 250/305, 250/306, 310, 311, 397; 382/145
See application file for complete search history.

(56) References Cited

U.S. PATENT DOCUMENTS

| 4,831,255 A | * | 5/1989 | Krivanek | ........... 250/305 |
| 6,855,927 B2 | * | 2/2005 | Taniguchi et al. | ........... 250/305 |
| 2004/0000641 A1 | | 1/2004 | Taniguchi et al. | |

FOREIGN PATENT DOCUMENTS

| EP | 0 409 209 A2 | 1/1991 |
| JP | 2001-148231 | 5/2001 |
| JP | 2004-214057 | 7/2004 |

* cited by examiner

*Primary Examiner*—Nikita Wells
(74) *Attorney, Agent, or Firm*—Blank Rome LLP

(57) ABSTRACT

The inventive device for obtaining the electron energy loss image and/or spectra includes an image sensor, a control for at least two deflectors for alternately exposing at least two photosensitive parts of the image sensor, sensor reading means for generating the representative signal of an image captured by each photosensitive part of the image sensor, means for synchronizing the deflector and the reading means for successively controlling the exposition of the photosensitive part and the reading of the other photosensitive part for each photosensitive part and means for combining the two image parts in such a way that a spectrum is formed.

14 Claims, 7 Drawing Sheets

DEVICE FOR OBTAINING THE IMAGE AND/OR SPECTRA OF ELECTRON ENERGY LOSS

CROSS-REFERENCE TO RELATED APPLICATIONS

This application is a National Phase Application of PCT/EP2005/053745, which claims priority to FR 0408633, which is hereby incorporated by reference.

FIELD OF THE INVENTION

The present invention relates to a device for acquiring images and/or electron energy loss spectra. It applies in particular to acquiring images in multimode mode (high-speed mode and high-resolution mode) and to fast acquisition of electron energy loss spectra of very large dynamic range.

BACKGROUND OF THE INVENTION

Changes in the needs of laboratories who use electron microscopes as investigation tools, and in particular changes in themes towards studying materials at nanometric scale are requiring increasingly high-performance investigation means. In electron microscopy, the techniques used are changing towards quantitative use of images, requiring acquisition methods to be developed.

An electron energy loss spectrum is made up mainly of two zones, namely a low-loss (LL) zone, which is generally a high-intensity zone and includes the zero-loss reference spectrum line followed by plasmons, and a core-loss (CL) zone which usually extends from a few hundred to a few thousand electron volts (eV). The ratio of the intensities between the two zones can reach $10^9$ and does not make it possible, in the prior art, to record the entire spectrum simultaneously.

The detectors currently used for recording such spectra are of the Charge Coupled Device (CCD) type and are highly cooled, thick (front-illuminated), or thin (back-illuminated) when better efficiency is sought or when the wavelength so requires (wavelength shorter than 450 nm).

The best detectors currently available offer a dynamic range of the order 10,000, and highly exceptionally it is possible to approach 100,000, i.e. respectively a factor of 100,000 or of 10,000 short of being capable of sensing simultaneously intensity ratios of $10^9$. The five or four decade shortfall requires the spectrum to be recorded in two independent sequences. For recording the low-loss zones, the recording starts with exposure for a very short time (100 μs, for example). If the number of electrons of the spectrum is high, then, in order to avoid problems of saturation, the detector is generally read line-by-line, which takes a non-negligible length of time, and then the detector is rinsed completely, and a second exposure is effected in order to record the core-loss zone, with a much longer exposure time in order to obtain a significant signal. In which case, it is observed that the low-loss zone of the spectrum can be very highly saturated. At the end of the second exposure, the detector is read by summing the contents of the lines portion by portion (summing referred to as "partial binning") or of all of the lines (summing referred to as "total binning") as a function of the pixel fill rate.

All of these operations require the image-taking to be slow, which adversely affects acquisition of an electron energy loss spectrum and, in particular, prevents fast acquisition of electron energy loss spectra of very large dynamic range.

In addition, prior art devices require the power source to remain stable (100,000 to 1,000,000 volts) for one minute, or even longer, making them vulnerable to the slightest variations in power supply voltage.

Finally, prior art devices do not make it possible to obtain high precision in positioning the energy peak, which precision is necessary for identifying the characteristic distributions in the energy loss spectrum.

BRIEF SUMMARY OF THE INVENTION

An object of the present invention is to satisfy these needs.

To this end, the present invention provides a device for acquiring images and/or electron energy loss spectra, said device being characterized in that it comprises:

an image sensor;

control means for controlling at least one deflector adapted to expose in alternation at least two photosensitive portions of the image sensor; reading means for reading the sensor, which means are adapted to generate a signal representative of the image sensed by each photosensitive portion of the image sensor;

synchronization means for synchronizing the deflectors and the reading means, which synchronization means are adapted to cause, for each photosensitive portion (LL and CL) in succession, firstly said photosensitive portion to be exposed and secondly another, different photosensitive portion to be read; and combination means for combining two image portions so as to form a spectrum.

By means of these provisions, the dynamic range of the sensor can be increased by causing the exposure time of the various photosensitive portions to vary. In addition, the exposures and reads of the various photosensitive zones of the image sensor make it possible to sense the image of various portions of an energy loss spectrum, it being possible for the image to be taken continuously.

According to particular characteristics, the synchronization means are adapted to cause different exposure times to be applied for different successive exposure time intervals.

By means of these provisions, the portions of the spectrum that have widely differing intensities can be sensed during adapted exposure times.

According to particular characteristics, the synchronization means are adapted and take into account that the reading speeds at which the different photosensitive zones are read are different.

According to particular characteristics, the reading means are adapted to perform, firstly line-by-line reading of a photosensitive portion and secondly accumulation of electrical charges from photosites of a photosensitive portion prior to reading.

By means of these provisions, the read time can be modified from one photosensitive portion to another, e.g. so as to correspond to the different exposure times of the different photosensitive portions.

According to particular characteristics, the device as briefly described above further comprises summing means adapted to sum the values of the signals corresponding to different lines of a portion read line-by-line.

According to particular characteristics, the image sensor further comprises, for at least one photosensitive portion, at least two portions whose reading means are independent.

By means of these provisions, the signal-to-noise ratio of the device is improved for the photosensitive zones that are read slowest.

According to particular characteristics, the device as briefly described above further comprises two deflectors adapted to shift the image in both directions of the image sensor.

According to particular characteristics, the device as briefly described above further comprises a fast blanking deflector adapted to shift the spectrum out of the detector during positioning of each other deflector serving to expose, in alternation, at least two photosensitive portions of the image sensor.

Thus, the response time of the deflection is negligible relative to the exposure times used for recording the various portions of the spectrum. It is thus possible to prevent the detector from recording a blur or streak due to the spectrum going past during the movements of the beam from one photosensitive zone to the other.

According to particular characteristics, the deflector that acts on the spectrum in the energy dispersive direction is of the electrostatic type, the variation in potential being obtained by an electronic switch that makes it possible to switch over instantly from the high reference voltage to ground.

Thus, fast switching is implemented while also maintaining the stability and the precision of the two voltages.

According to particular characteristics, the device as briefly described above further comprises optical transfer means comprising at least one lens.

According to particular characteristics, the device as briefly described above further comprises a spectrometer adapted to form an electron energy loss spectrum at the surface of the image sensor.

According to particular characteristics, the reading means of the sensor are adapted to apply different gains to the signals coming from the two photosensitive portions of the image sensor.

BRIEF DESCRIPTION OF THE DRAWINGS

Other advantages, objects and characteristics of the present invention appear on reading the following description given by way of non-limiting explanation and with reference to the accompanying drawings, in which.

DETAILED DESCRIPTION OF THE INVENTION

Figure 1:
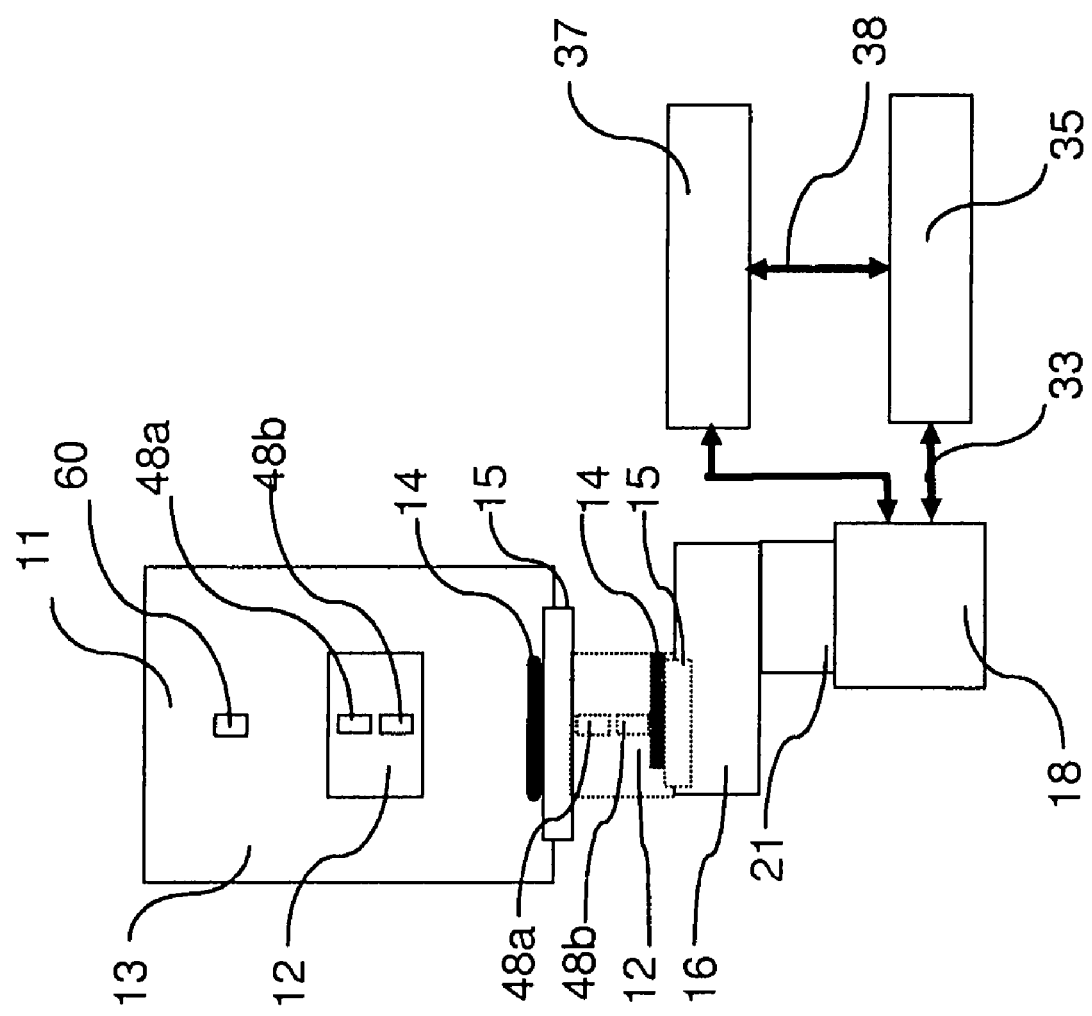
FIG. 1 is a block diagram of a particular embodiment of the device of the present invention.

The device 10 of the present invention whose structure is shown in FIG. 1 is used to form images in High-Speed (HS) mode or in High-Resolution (HR) mode, and to detect the electrons of an energy loss spectrum that are formed on an electron microscope 11 equipped with a spectrometer 12 disposed in or at the outlet of the column 13 of the electron microscope 11. The electron-photon conversion is performed by a scintillator 14 placed on a view port 15 which also provides vacuum-tightness.

Optical transfer means 16 make it possible to re-form an identical image on the sensitive portion of a CCD image sensor 17. This image sensor 17 is located in a detection head 21 (see FIG. 2) and it is cooled to in the range −30° C. to −60° C. depending on needs, i.e. depending on the exposure times that are necessary. For example, the image sensor is a commercially available product referenced ATMEL TH7899M that has 2084×2048 pixels of 14×14 µm. It is of the full frame transfer type and it has two read registers, each of which is provided with two channels (see description of FIG. 5). An electronic processing housing 18 is adjoined to a detection head including the image sensor 17.

The optical transfer means 16 preferably comprises lead glass lenses and optionally mirrors rather than optical fibers so that the X rays generated by the scintillator 14 do not disturb the system.

The spectrometer 12 and the electron microscope 11 have a deflector 48 of electrostatic type or of magnetic type that shifts the image formed on the image sensor 17 between the two photosensitive zones corresponding to respective ones of the two read registers.

Figure 2:
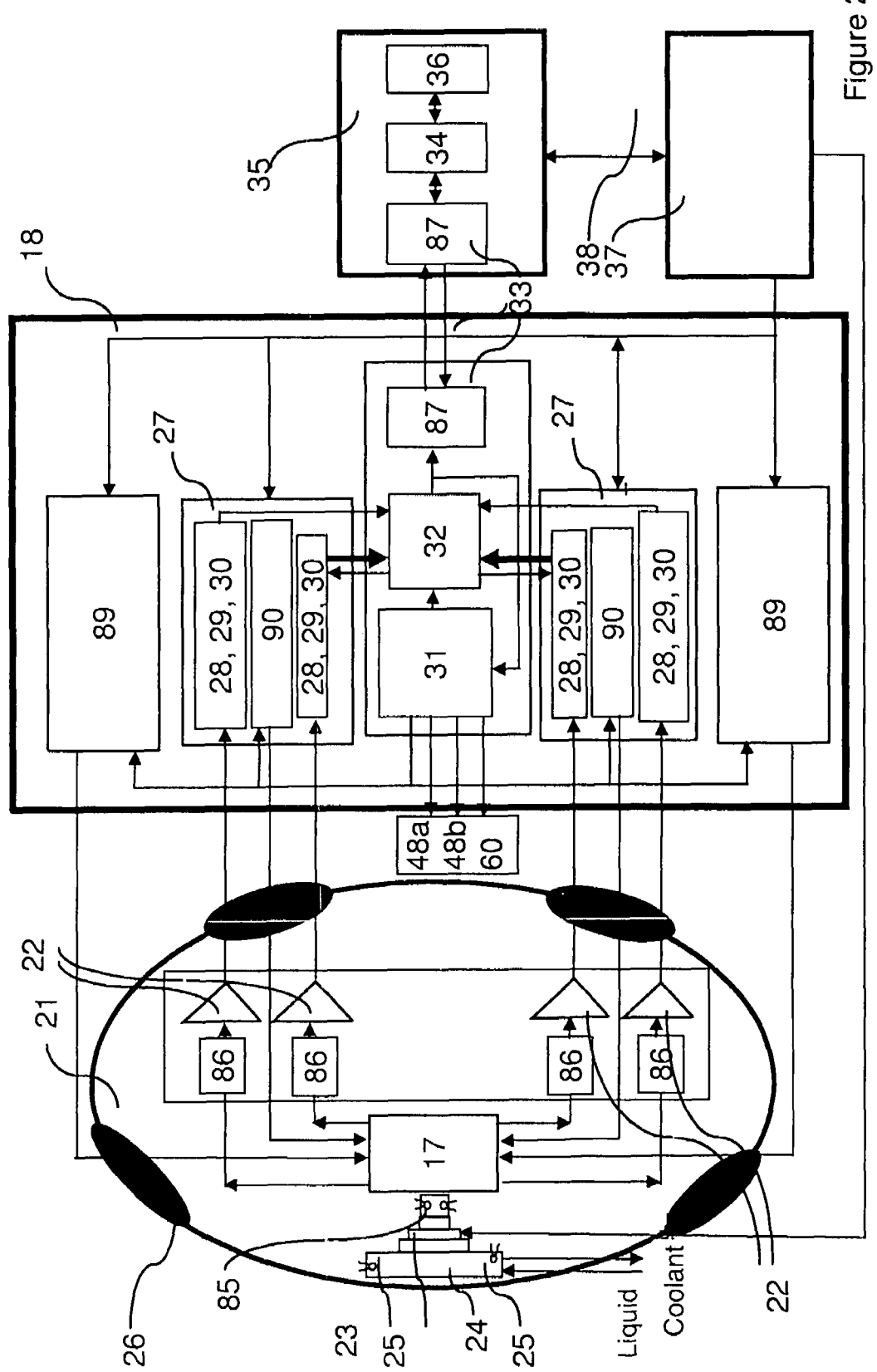
FIG. 2 is a block diagram of an electronic circuit of FIG. 1.

The general structure of the electronic processing circuits of the electronic housing 18 is shown in FIG. 2. A detection head 21 encloses a heat exchanger 24, temperature probes 25, Peltier-effect components 23 thermally connected via a "cold finger" 85 to the image sensor 17 (see the description of the image sensor 17 in FIGS. 5A and 5B). The outlets of the image sensor 17 are connected to high-pass filters 86 whose outlets are connected to preamplifiers 22. The outlets of the preamplifiers 22 pass through airtight connectors 26. Levels transposition circuits 89 perform level adaptation (translation and amplification) so as to adapt the amplitude and the power of the signals output by the controller to match the needs of the sensor. It should be noted that said levels are adjustable from a computer 35 and can thus easily be adapted to another type of detector.

For each read channel (the outlets of the preamplifiers 22), an electronic processing circuit 27 has amplification means 28, analog processing means 29 (blocker sampler, summing circuit, dynamic compensation and static compensation for adjusting the level of the threshold in the absence of signal and with a very short time; since these adjustments are performed automatically, a value of 50 analog-to digital units (ADUs) out of 65535 in HR mode is very stable), and digitizing means 30. A controller 31 controls an arithmetic unit 32 and controls the deflectors 48a, 48b, and optionally a fast blanking deflector 60 so as to expose alternately at least two photosensitive portions of the image sensor 17 and so as to displace the spectrum outside the detector, when the deflector 48 is used. The fast deflector 60 is preferably situated at the top of the column. The fast blanking deflector 60 is adapted to shift the spectrum out of the detector during the positioning of each deflector 48a and 48b. The deflector 48a acts on the spectrum in the energy dispersive direction, which is horizontal in FIG. 5A, and is preferably of the electrostatic type. The deflector 48b acts perpendicularly to the axis of the spectrum and is preferably of the magnetic type. The controller 31 constitutes means for synchronizing the deflector and means for reading the image sensor 17. For each photosensitive portion, the controller 31 successively causes firstly exposure of said photosensitive portion and secondly reading of another, different photosensitive portion.

A connection of the arithmetic unit 32 is connected to a transceiver 87 itself connected to a high data rate serial line 33. The output signals conveyed by the serial line 33 are received by a specific electronic transmit-receive card 34 disposed in a computer 35 (e.g. of the personal computer (PC)

type) which is also equipped with an ultra-fast (80 megabytes per second (Mbytes/s)) Peripheral Component Interconnect (PCI) card 36 that receives the parallel data (20 lines) from the high data rate serial line 33. A power supply and control cabinet 37 is controlled by the computer 35 via an opto-coupled RS232 line 38. The power supply and control cabinet 37 performs electrical and electronic power supply and also all of the functions for measuring and controlling the temperature of the image sensor 17 as well as the safety functions, as regards both the thermal aspects and the aspects relating to the limit voltages that the image sensor 17 can withstand without being damaged.

The components and circuits 90 bias the image sensor 17 and measure the various temperatures necessary for providing temperature regulation and safety for the image sensor. The biases of the image sensor 17 are adjustable from the computer 35.

The device shown in FIGS. 1 and 2 performs a dual function: operation in high-speed mode and operation in high-resolution mode, described below.

Operation in high-speed mode includes 3 operating ranges corresponding to 42 ("HS3" mode), 24 ("HS2" mode), and 13 ("HS1" mode) images per second with zero exposure time.

This video mode makes it possible to focus the microscope manually or automatically and to record in real time sequences of images necessary for observing and recording fast transient phenomena such as displacement of dislocations, for example; unlike with the video cameras used in the prior art, this mode keeps the same field of observation as the "high resolution" time (see below). The read rate is adapted by adjusting the exposure time.

The fast analog-to-digital converter requires at least a minimum time of 45 ns for performing a conversion correctly, and the maximum sampling frequency is 10 MHz.

As a result, under these conditions, and in order to remain in a simple configuration, the frequency used to read the image sensor 17 with this converter must not exceed 10 MHz.

As mentioned above, it should be noted that the converter requires a minimum time of 45 ns for the sampling. At the frequency of 10 MHz, the plateau or dwell time of the signal is 50 ns. It is essential to position the main signals delivered by the controller 31 to the processing unit 27 in time as a function of the delay of the processed analog signal. With a clock frequency of 64 MHz, the adjustment pitch of the delay is 7.813 ns. Under these conditions, it is preferable for said dwell time to reach at least 52.81 ns. In operation at a frequency of reading the CCD at 8 MHz, said time is 62.5 ns, which leaves a sufficient margin of 9.69 ns. With this frequency of reading of the image sensor 17, the rate is not changed very much, focusing is facilitated and operation is made much more secure. It should also be noted that, at this frequency, the read noise is still very acceptable, as described below.

The following table gives the performance obtained. The minimum exposure time is given by the results given by the preceding table. An image is acquired, processed, and viewed during the exposure time of the preceding image. The equivalent exposure time is computed relative to the high-resolution mode (see below) without binning (or summing) and in full window.

| Binning | Read time (ms) | Typical exposure time (ms) | Rate (images/s) | Equivalent exposure time HR, B 1 × 1 (ms) | Number of pixels | Spatial Resolution (µm) |
|---|---|---|---|---|---|---|
| 8 | 23.74 | 25 | 20.50 | 159.3 | 256 × 256 | 112 |
| 4 | 41.28 | 50 | 10.96 | 159.3 | 512 × 512 | 56 |
| 2 | 76.31 | 100 | 5.67 | 159.3 | 1024 × 1024 | 28 |

The video signal is sampled on the reference plateau and on the signal plateau. It is thus "blocked" on the reference plateau.

The passband of the amplification channel that is necessary for a CCD read frequency of 8 MHz is 37.9 MHz. For each of the signals, we give the frequency and the time:

| For horizontal shift signals | PhiL: | 8 MHz | 62.5 ns |
| For the summing signal: | PhiS: | 4 MHz | 187.5 ns |
| For the reset signal: | PhiR: | 4 MHz | 37.5 ns |
| Blocking: | | 4 MHz | 62.5 ns |
| Sampling: | HSx | 8 MHz | 62.5 ns |

Volume of data per image in HS3 mode: 131 kilobytes

Figure 3:
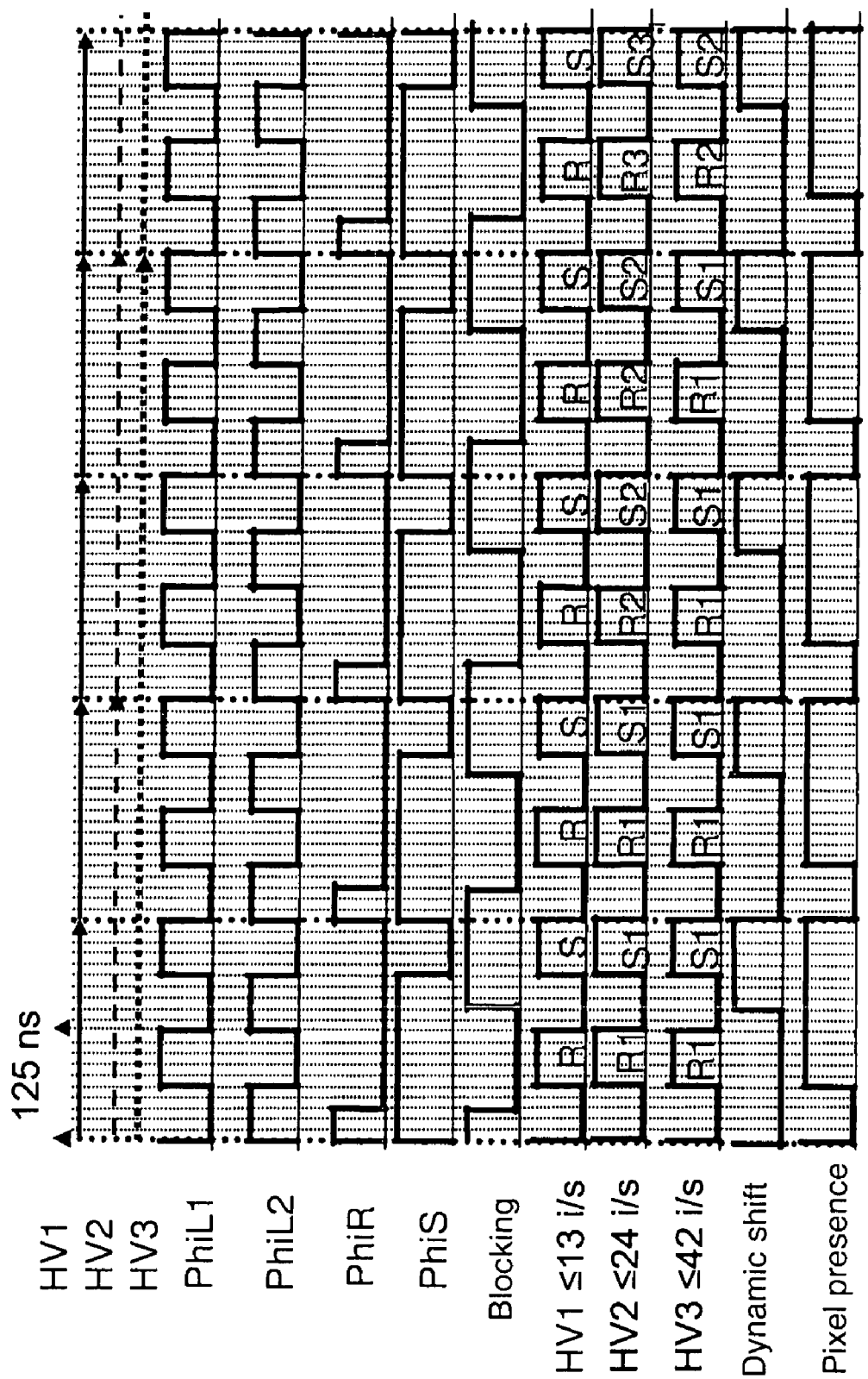
FIG. 3 is a timing diagram of operation of an image sensor and of additional electronic circuits shown in FIGS. 1 and 2 for operation in high-speed mode.

Record time with viewing in real time without using the hard disk with 512 Mbytes available (1 gigabyte of RAM) without compression: 215 s For the image sequence shots, the timing diagrams given in FIG. 3 indicate that they are identical to the preceding ones. The horizontal binning is performed by digital summing by the arithmetic unit 32.

Volume of data per image in HS2 mode: 524 kilobytes

Record time with viewing in real time without using the hard disk with 512 Mbytes available (1 gigabyte of RAM): 54 s Volume of data per image in HS1 mode: 2048 kilobytes Record time with viewing in real time without using the hard disk with 512 Mbytes available (1 gigabyte of RAM): 13.5 s In the embodiment described here, the short exposure times and the relatively high read frequency make it preferable for operation to be non-multi-pinned-phase (non-MPP) operation (MPP being a type of CCD architecture making it possible to reduce the dark current by a factor of 25), the maximum capacity of the potential well of the read register is HS1 530 ke-, and the total noise calculated for an operating temperature at −30° C. is:

| HS1: | 530 ke- | 48 e- |
| HS2: | 1060 ke- | 63 e- |
| HS3: | 2126 ke- | 89 e- |

Figure 4:
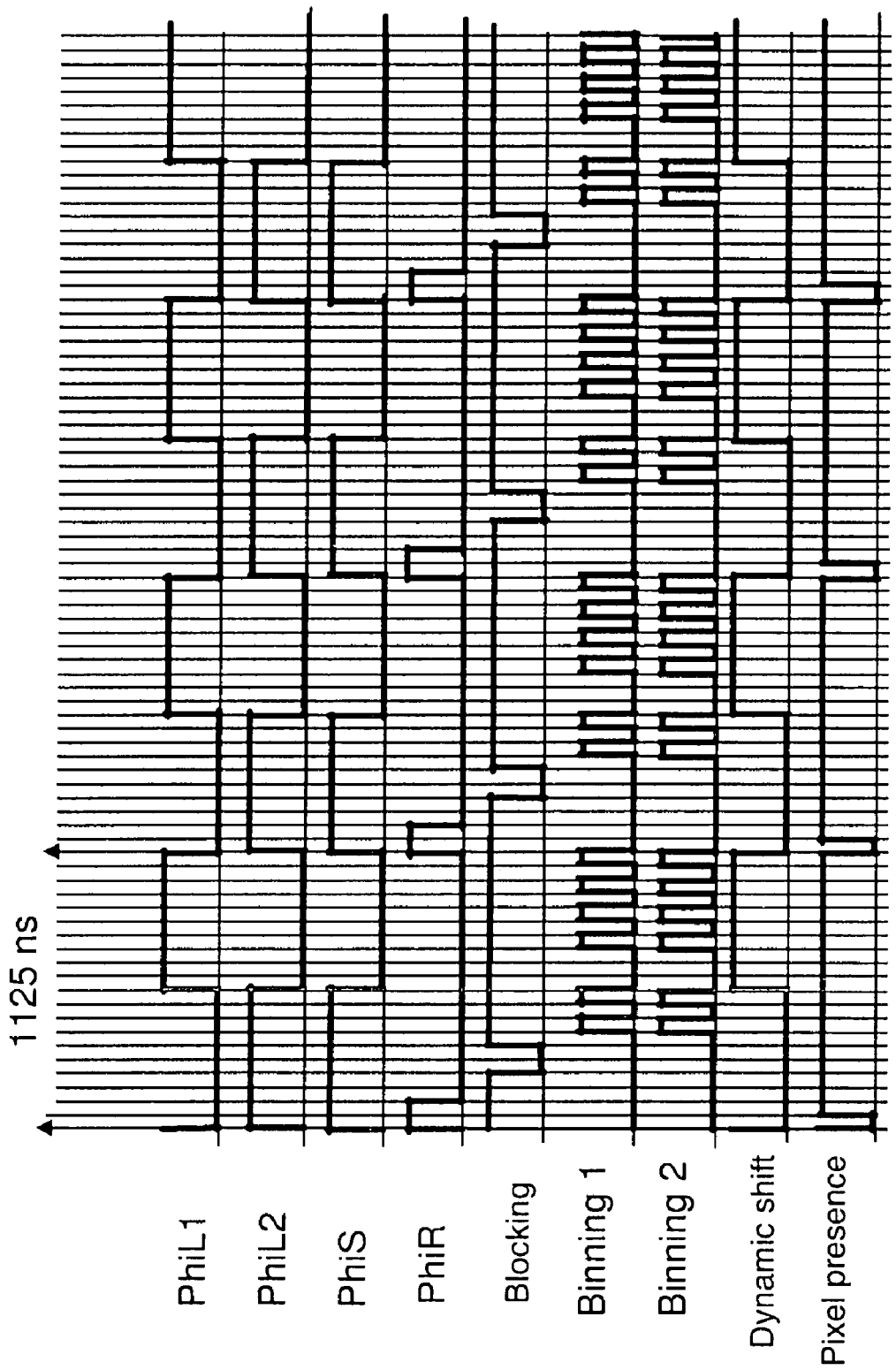
FIG. 4 is a timing diagram of operation of an image sensor and of additional electronic circuits shown in FIGS. 1 and 2 for operation in high-resolution mode.

In high spatial resolution and low noise operation, the full image without binning is read in 1.27 seconds. FIG. 4 shows that the read frequency is 889 kHz and that the sampling frequency is 8 MHz, the passband of the amplification channel at this read frequency of the CCD is 14.1 MHz. A blocker sampler situated in the processing portion 29 is blocking for 125 ns on the reference plateau, and it makes it possible, in particular to eliminate the effect of shift of the video line due to the high-pass filter 86 at the inlet of the preamplifier 22.

This leaves time for applying double sampling on the reference plateau and quadruple sampling on the signal plateau. A dynamic correction signal makes it possible to compensate for the effect of the gate-source capacitive coupling on the outlet stage of the CCD during reading of the signal of plateau.

For a maximum high-resolution imager charge of 209 ke-, i.e. a conversion gain of 3.19 e-/ADU, the total noise measured is 17 e-. The electron gain per pixel on incident electron on the scintillator is 54.

In high-resolution, the 2×2, 4×4, or 8×8 binnings can be used.

For all of the modes, the image can be windowed. In high resolution, the charges of the CCD that are situated outside the window are transferred at high speed.

Outside reading, the background task is rinsing of the detector.

The description below returns to recording an electron energy loss spectrum (EELS) and assumes a stationary energy loss spectrum, acquisition requiring the follow sequence:
1. rinsing the detector;
2. exposure for the low loss zone (LL exposure);
3. reading of the low loss zone;
4. exposure for the core loss zone (CL exposure); and
5. reading of the core loss zone.

The rinsing and the read times are dead times (i.e. they do not make it possible to perform other exposures) that implementation of the present invention makes it possible to eliminate by creating concomitance between image sensor exposure and reads (rinsing is not taken into account, continuous reading rinsing the sensor by removing therefrom the charges created by thermal effect). In addition, the device of the present invention gives the recording a dynamic range that can reach $10^9$, which corresponds to the maximum ratio of the intensities between the low loss zone and the core loss zone.

To this end, the present invention implements a sequence of operating steps of the image sensor that is described in detail below for a particular image sensor, the present invention not being limited to this type of image sensor but rather extending to any image sensor having at least two read registers situated on either side of the detection zone.

Figure 5A:
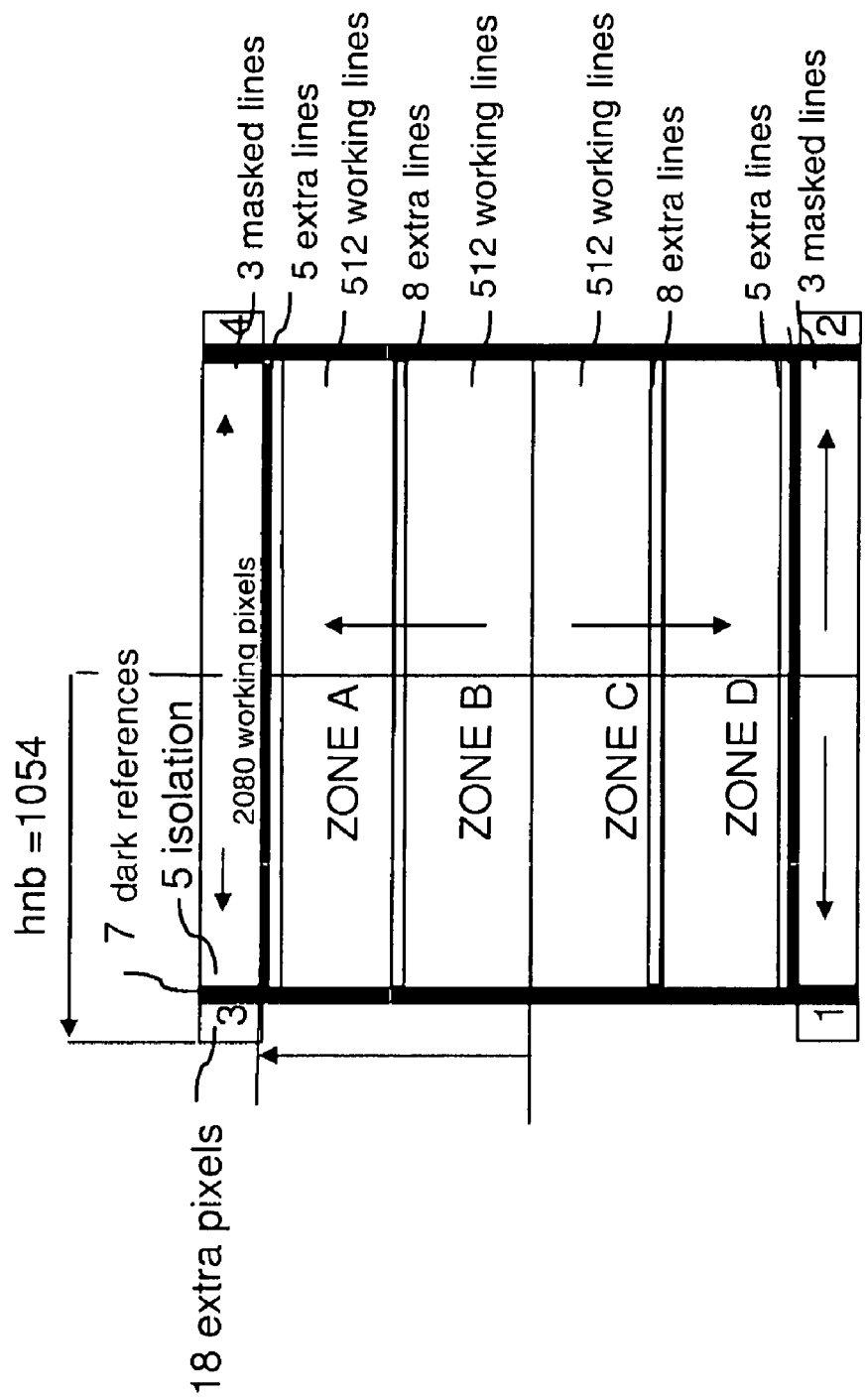
FIGS. 5A and 5B are diagrams of an image sensor of the device shown in FIG. 1.

The structure of the CCD 7899M image sensor is provided with four zones of 520 lines in which the vertical charge transfers can be performed independently. FIG. 5A shows the structure of the TH7899. The zones A and B are read in the register A, the zones C and D are read in the register B. For implementing the present invention, the separation into four zones (full frame transfer CCD) is preferred since it offers greater flexibility in data management, but it is not essential.

The present invention can implement image sensors that are thin or otherwise, and micro-lens devices or interline devices. Active Pixel Sensors (APSs) having Complementary Metal Oxide Semiconductor (CMOS) transistors can also be used but, on the date of filing of the present patent application, they suffer from lower performance in terms of sensitivity and dynamic range. However, it is preferable to have a vertical deflection and a horizontal deflection on the spectrometer in order to place the spectrum in position on the zone B for the low losses and at the zone C for the core losses, and to have a blanking deflector.

The personal computer 35 constitutes means for combining the signals coming from the various portions of the image sensor in order to form a spectrum. The personal computer 35 also constitutes summing means adapted to summing the values of the signals corresponding to various lines of a portion of the image sensor 17 that is read line-by-line. A spectrum example is given in FIG. 6.

Figure 5B:
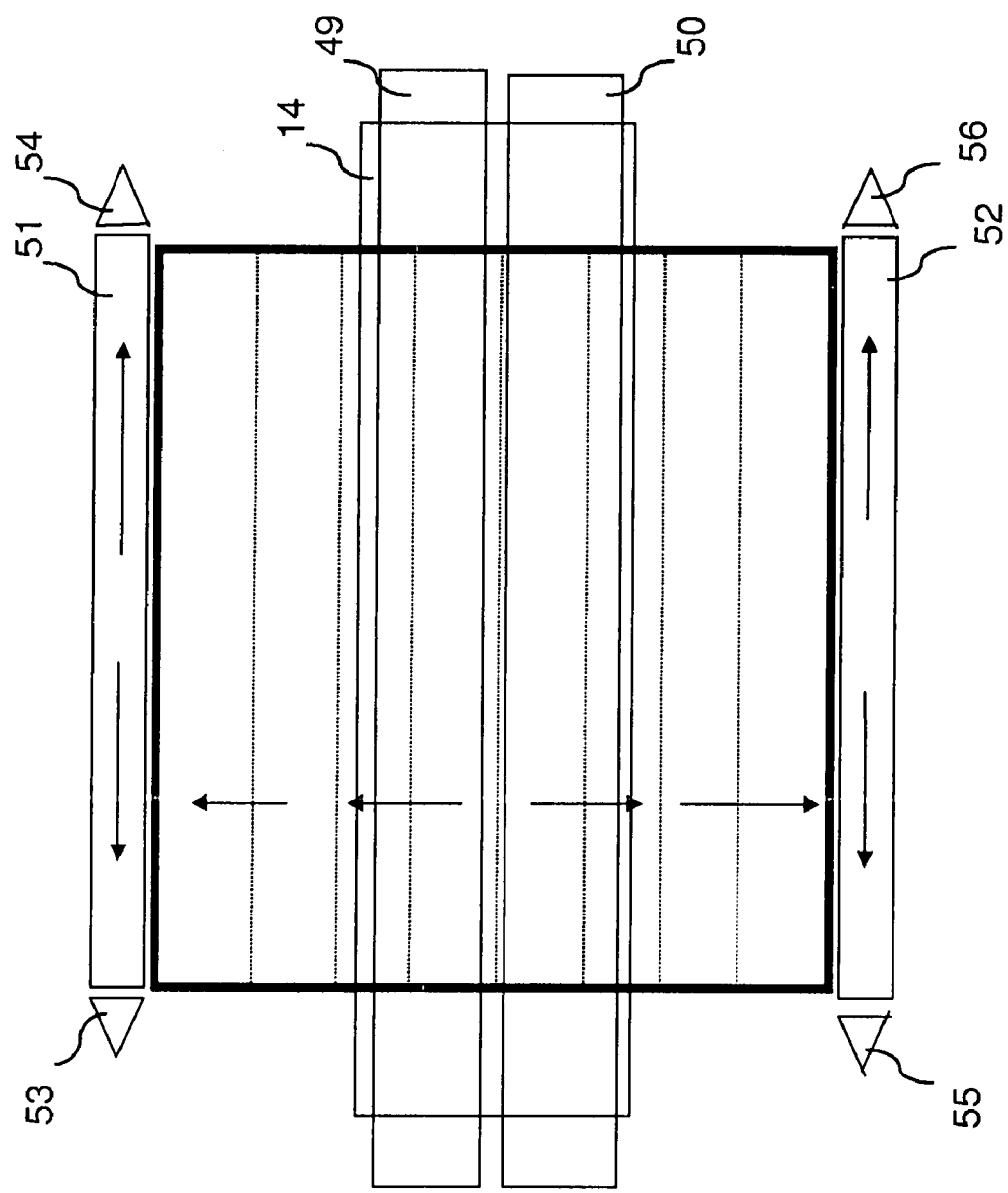

FIGS. 5A and 5B show implementation of the method of the present invention. In these figures, the top portion 49 (zone B) of the image sensor 17 is assigned to low losses, the low portion 50 (zone C) being specialized for core losses. The zones "B" and "C" shown in FIGS. 5A and 5B serve to transfer frames into a storage zone that is read line-by-line, during the exposure of the photo-sensitive portions.

For continuous-mode acquisition, which is suitable for an image spectrum or for acquiring a line spectrum in multi-acquisition mode, preference is given to reducing the spectrum acquisition time so as to keep recording times of no longer than a few minutes in filtered imaging.

It is recalled that a filtered image is obtained by recording thousands of line spectra. However, a line spectrum is also rarely recorded in a single acquisition. That is advantageous for reducing the effects of drift of the spectrum, firstly by readjustment by using the zero loss position and secondly by reducing the thermal current of the image sensor 17 whose effect is non-negligible when the charges of all of the lines are summed. With cooling to −50° C., the thermal current of the sensor generates noise of 3 electrons for summing (binning) of ×256 pixels and exposure of 1 s.

The displacement of the spectrum uses a particular strategy, and our device, in its particular embodiment shown in FIG. 2, has three control signals coming from the controller 31 and that it is possible to synchronize with high temporal precision, and that are adapted to the characteristics of the various deflectors.

As shown in FIGS. 5A and 5B, the image sensor 17 has two read registers 51 and 52 and four read channels 53 to 56.

In the embodiment shown in the figures, the useful or working height of the spectrum reaches 3.5 mm and thus occupies 250 lines of the image sensor 17, which actually has 2080 lines, the nearest sub-multiple being 260 pixels. The image sensor 17 is thus virtually subdivided into 8 regions, as shown in FIG. 5B. This subdivision depends on the dimension of the spectrum in the direction that is not energy dispersive and must be optimized as a function of this parameter.

It is now possible to describe the means that make it possible to eliminate the dead times and to achieve the dynamic range that is necessary over the recording. By way of example, we have given recording times for the TH7899M that has 2080×2080 useful or working pixels and whose main characteristics are as follows:
Pixels of 14×14 μm;
the vertical transfer time for vertically transferring one line, Ttvl is 6 μs; and
the maximum read frequency for reading the register is 8 MHz, and it can be lowered for reading LLs in order to reduce the read noise.

Under these conditions, let us calculate, as is necessary below, the read time for reading one line:

$$Tll = 1054 * \frac{1}{Fl}$$

where Fl is the read frequency

First step: vertical transfer without reading of the register 52 of the charges accumulated in the core loss (CL) zone during the exposure of the preceding spectrum and exposure of the low loss (LL) zone. The spectrum is at 49.

a) For the transfer from the core loss (CL) zone:
N=8 (subdivision of the CCD into 8 zones)
Height of the spectrum: 3.640 mm $$Nl = \frac{2080}{N} = \frac{2080}{8} = 260$$

The transfer time for transferring the CLs is:

$$TtCL = \frac{2080}{N} * Ttvl = 260 * 0.006 = 1.560 \text{ ms}$$

b) The exposure time of the LLs is:

TpLL=TtCL=1.560 ms

Second step: exposure of the core loss (CL) zone, reading of the low loss (LL) zone line-by-line, and reading of the read register 52 in which the charges of the CLs of the preceding spectrum are summed. The spectrum is at 50.
a) For reading the low loss (LL) zone:

TILL=TII*NI+NI*Ttvl

Where FI=8 MHz $$TiLL = 1054 * \frac{1}{8*10^6} * 260 + 260 * 6 * 10^{-6}$$

TILL=35.815 ms b) For reading the core loss (CL) zone of the preceding spectrum, it is recommended to choose an optimum frequency so as to be able to reduce the read noise to a value that is as low as possible:

$$FICL = \frac{1054}{TILL} = 29.43 * 10^3$$

$$TICL = \frac{1054}{FICL} = 35.815 \text{ ms}$$

The signal-to-noise ratio is reinforced by considerably decreasing the reading frequency of the image sensor 17. Thus, considerable reductions are obtained in the read noise of image sensor 17 and in the noise of the electronics by limiting the passband. This adjustment of the passband is optimized by the correlated digital multi-sampling that we are using. It is recalled that the purpose of correlated double sampling is almost to eliminate the reset noise. With a fast converter, it is possible to sample N times on each plateau and thus to reduce by $N^{0.5}$ certain noise affecting the signal.

The total noise is thus reduced to 5 e-. This value is obtained with a temperature of the detector of −30° C., an exposure time of 50 ms in MPP mode, and summing or binning of 1×256. It should be noted that, under these conditions, the device makes it possible to discern a single electron of the spectrum. For reading the core loss (CL) zone, with the same temperature, the depth of the potential well reaches 530 ke-, with 1×1 binning or summing, and in non-MPP operation, the total noise is higher.

c) For exposure of the core loss (CL) zone
With the choices a) and b):

TpCL=35.815 ms

Preferably, a different and preferably higher gain is applied to the CL read channels, e.g. a gain that is four times higher than the gain applied to the LL read channels. Thus, the signal-to-noise ratio is improved. The depth of the potential well is 132.5 ke- i.e. Ga said ratio. With this data it is now possible to calculate the gain of the dynamic range $$Gd = \frac{TpCL}{TpLL} * NI * Ga$$

$$Gd = \frac{35.815}{1.560} * 260 * 4 = 23877$$

The dynamic range of the device of the present invention in this embodiment is equal to:

Dg=Gd*Dc where Dg is the overall dynamic range;
where Dc is the dynamic range of the image sensor 17 and of its associated electronics;

$$Dc = \frac{CHmaxCL}{NoiseCL} = \frac{132.5 * 10^3}{5} = 26500$$

Dg=23877*26500=0.633*10⁹

It can thus be said that the improvement in the dynamic range is obtained by multiplying three factors:
1. the ratio of the exposure times for the zones 49 and 50; and
2. the ratio of the number of lines associated in the zones 49 and 50; and
3. the ratio of the gains of the zones 50 and 49.

It should be noted that, by implementing the present invention, the dead times (times for which no exposure takes place) are almost zero. Under the conditions described above, the recording time for recording an image spectrum of 64×64 points is:

Te=(TpLL +TpCL)*64*64=153.1 s

Blocks of 104 lines are now chosen, when the image sensor 17 contains 20 spectra, N=20. It is naturally necessary to adapt the height of the spectrum. The spectrum is limited to 1.456 mm by adjusting the current of a lens associated with the spectrometer, or by diaphragming the beam at the outlet of the spectrometer. The times then become as follows:
a) Transfer of the core loss (CL) zones:

TtCL=TpLL=0.624 ms b) Reading of the low loss (LL) zone:

TILL=TICL=TpCL=14.326 ms

Where FICL=73 kHz
It is then possible to calculate the dynamic range gain:

$$Gd = \frac{13.702}{0.624} * 104 * 4 = 9135$$

Dg=Gd*Dc

Dg=2.42*10⁸

Under these conditions, the acquisition time for acquiring an image spectrum of 128×128 points is:

Te=14.326*128*128=234.7 s

The present invention applies to quantitative analysis. Quantitative analysis of electron energy loss spectra is based on knowledge of the total integral of the spectrum. The dynamic range of the spectrum (greater than $10^8$) requires, with current sensors, two information takes with the operating conditions being changed. This work is not facilitated because of the almost total absence of automatic procedures making it possible to collect the data.

Figure 6:
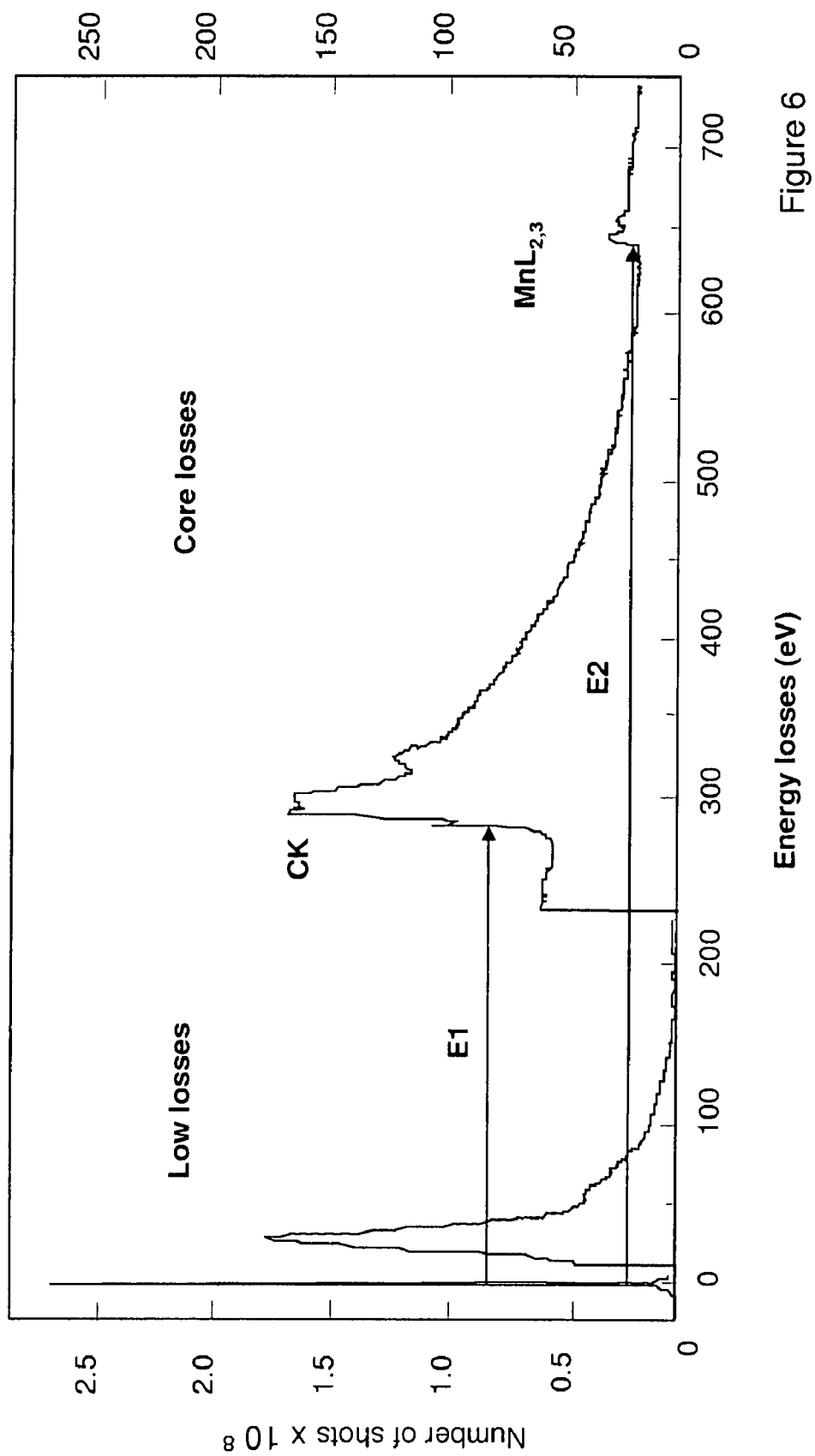
FIG. 6 shows portions of energy loss spectra obtained by implementing the device shown in FIGS. 1 to 5.

In the spectrum shown in FIG. 6, the spectrum line K of Carbon can be seen. Its intensity is very small and superposed on a continuous background.

It can be observed that the present invention makes it possible to obtain up to 700 spectra per second, i.e. 7 times the number obtained with prior art devices.

The present invention also applies to self-referencing of the spectra. The device of the present invention makes it possible to acquire the peak without energy losses that is at the origin of the energy loss spectrum. Thus, it is possible to determine with a precision of a few hundredths of electron volts the absolute position of an energy loss. In the prior art, such measurement assumes stability of the high voltage of the microscope (100,000 volts to 200,000 volts, i.e. 0.1 ppm) over a period of time of about one minute. The device of the present needs such stability over only a time of less than one second.

In the case of the spectrum shown in FIG. 6, the absolute position of the peak of iron (about 708 eV) or of nickel gives information about their states of oxidation.

The present invention also applies to access to the single diffusion spectrum. Once again, knowledge of the full spectrum makes it possible, by means of a calculation either of the Fourier log type or of the Fourier ratio type, to access the single diffusion spectrum. In addition to access to the local thickness of the sample, this processing opens up access to quantifications of spectra with references. Multiple diffusions change the shapes of the energy loss thresholds in non-linear manner, this makes it very complex, or even impossible, to quantify the data using prior art tools.

The present invention also applies to improving the energy resolution. Having the full spectrum makes it possible to improve the energy resolution of spectra by means of algorithms based on maximum likelihood (Richardson-Lucy) or on maximum entropy. With a simple extension, it is a promising alternative to the preceding algorithms. Single diffusions are accessed with a result that is less noisy and offering higher energy resolution.

The present invention also applies to spectroscopy or image mode work with the same image sensor. For microscopes whose spectrometer is incorporated in the column, and which are mainly manufactured by LEO Microscopie Electronique, a division of Carl Zeiss, registered trademarks, and JEOL (Japan Electron Microscopy Limited), registered trademark, it is necessary to have a camera capable of working both in image mode and in spectroscopy mode. The device of the present invention satisfies these conditions entirely.

The present invention also applies to "image-spectra". Since 1990, at the Laboratoire de Physique des Solides (Solid Physics Laboratory), we have been developing the "image-spectra" technique which consists in acquiring an electron energy loss spectrum at each point of the sample during scanning thereof by an electron probe. Our sensor, by adding a few milliseconds to the time per pixel, makes it possible to have all of the above-mentioned quantitative information. It will enable this technique to made great progress. In addition, we already have most of the computer tools necessary for storing and for processing such a volume of data.

The invention claimed is:

1. A device for acquiring images or electron energy loss spectra, said device comprising:
   an image sensor;
   control means for controlling at least two deflectors configured to expose, in alternation, at least two photosensitive portions of the image sensor;
   reading means for reading the sensor, which means are configured to generate a signal representative of an image sensed by each photosensitive portion of the image sensor;
   synchronization means for synchronizing the deflectors and the reading means, which synchronization means are configured to cause, for each photosensitive portion in succession, firstly said photosensitive portion to be exposed and secondly another, different photosensitive portion to be read; and
   combination means for combining two image portions so as to form a spectrum.

2. A device according to claim 1, wherein the synchronization means are adapted to cause different exposure times to be applied for different successive exposure time intervals.

3. A device according to claim 1, wherein the synchronization means are configured to and take into account that reading speeds at which the different photosensitive zones are read are different.

4. A device according to claim 3, wherein the reading means are adapted configured to perform, firstly line-by-line reading of each photosensitive portion and secondly accumulation of electrical charges from photosites of each photosensitive portion prior to reading.

5. A device according to claim 1, further comprising summing means configured to sum values of the signals corresponding to different lines of a portion read line-by-line.

6. A device according to claim 1, wherein the image sensor further comprises, for at least one photosensitive portion, at least two portions whose reading means are independent.

7. A device according to claim 1, wherein the device further comprises two deflectors configured to shift the image in both directions of the image sensor.

8. A device according to claim 1, further comprising a fast blanking deflector configured to shift the spectrum out of the detector during positioning of each other deflector serving to expose, in alternation, at least two photosensitive portions of the image sensor.

9. A device according to claim 1, wherein the deflector that acts on the spectrum in an energy dispersive direction is an electrostatic type, a variation in potential being obtained by an electronic switch switches over instantly from a high reference voltage to ground.

10. A device according to claim 1, wherein the deflectors are configured to shift the image in both directions of the image sensor.

11. A device according to claim 1, wherein at least one of the deflectors is of a magnetic type.

12. A device according to claim 1, wherein the device further comprises optical transfer means comprising at least one lens.

13. A device according to claim 1, wherein the device further comprises a spectrometer configured to form an electron energy loss spectrum at the surface of the image sensor.

14. A device according to claim 1, wherein the reading means of the sensor are configured to apply different gains to signals coming from the two photosensitive portions of the image sensor.

* * * * *